United States Patent
Aoki et al.

(12) 
(10) Patent No.: US 6,239,620 B1
(45) Date of Patent: May 29, 2001

(54) METHOD AND APPARATUS FOR GENERATING TRUE/COMPLEMENT SIGNALS

(75) Inventors: Naoaki Aoki; Sang Hoo Dhong; Nobuo Kojima, all of Austin, TX (US); Joel Abraham Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/450,982

(22) Filed: Nov. 29, 1999

(51) Int. Cl.[7] .................................................. H03K 3/3568

(52) U.S. Cl. ................................................. 326/95; 26/98

(58) Field of Search .................................. 326/95, 96, 97, 326/98; 327/202, 203, 208, 209, 210, 211, 212, 218

(56) References Cited

U.S. PATENT DOCUMENTS 5,179,300 * 1/1993 Rolandi et al. ........................ 326/98
5,894,229 * 4/1999 Yamoka et al. ........................ 326/83

* cited by examiner

Primary Examiner—Tuan T. Lam
(74) Attorney, Agent, or Firm—Casimer K. Salys; Bracewell & Patterson, L.L.P.

(57) ABSTRACT

A true/complement signal generator for a dynamic logic circuit having a dynamic node is disclosed. The true/complement signal generator for a dynamic logic circuit having a dynamic node includes a cascaded inverter circuit, a first half-latch circuit, and a second half-latch circuit. The cascaded inverter circuit, which is connected to the dynamic node, includes a first inverter connected in series with a second inverter. Connected to an output of the second inverter of the cascaded inverter circuit, the first half-latch circuit generates an output signal. Connected to an output of the first inverter of the cascaded inverter circuit, the second half-latch circuit generates a complement output signal.

14 Claims, 2 Drawing Sheets

METHOD AND APPARATUS FOR GENERATING TRUE/COMPLEMENT SIGNALS

BACKGROUND OF THE INVENTION

1. Technical Field

The present invention relates to logic circuits in general, and in particular to circuits for generating true/complement signals. Still more particularly, the present invention relates to a circuit for generating low skew true/complement signals.

2. Description of the Prior Art

Dual-rail systems are commonly used in static and dynamic logic circuits, such as adders, multipliers, sense amplifiers, etc. A dual-rail system typically requires the generation of true signal inputs and their complementary signal inputs.

For static logic circuits, a complementary signal input can conveniently be generated by passing a true signal input through an inverter. However, for dynamic logic circuits, such as domino circuits, a more sophisticated true/complement signal generator is commonly required. This is because dynamic logic gates generally have shorter time delays than static logic gates, which is the reason why dynamic logic circuits generally have a higher speed operation relative to their static counterparts.

Typically, dynamic logic circuits have a precharge phase and an evaluation phase. To ensure correct operation, dynamic logic circuits require that the input signal received a dynamic logic gate must either be stable before the beginning of the evaluation phase, or transition in only one predetermined direction during the evaluation phase. For example, a dynamic logic gate may require that an input signal be at a low voltage level during the precharge phase, and thus only low-to-high transitions are allowed during the evaluation phase. Hence, dynamic logic circuits in a dual-rail system tend to require their true and complement signal inputs to having more balanced timing. The present disclosure provides an improved true/complement signal generator for generating low skew true/complement signals to be used in high-speed dynamic logic circuits.

SUMMARY OF THE INVENTION

In accordance with a preferred embodiment of the present invention, a true/complement signal generator for a dynamic logic circuit having a dynamic node includes a cascaded inverter circuit, a first half-latch circuit, and a second half-latch circuit. The cascaded inverter circuit, which is connected to the dynamic node, includes a first inverter connected in series with a second inverter. Connected to an output of the second inverter of the cascaded inverter circuit, the first half-latch circuit generates an output signal. Connected to an output of the first inverter of the cascaded inverter circuit, the second half-latch circuit generates a complement output signal.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

The present invention is applicable to dynamic logic circuits in which the generation of true/complement signals are required.

Figure 1:
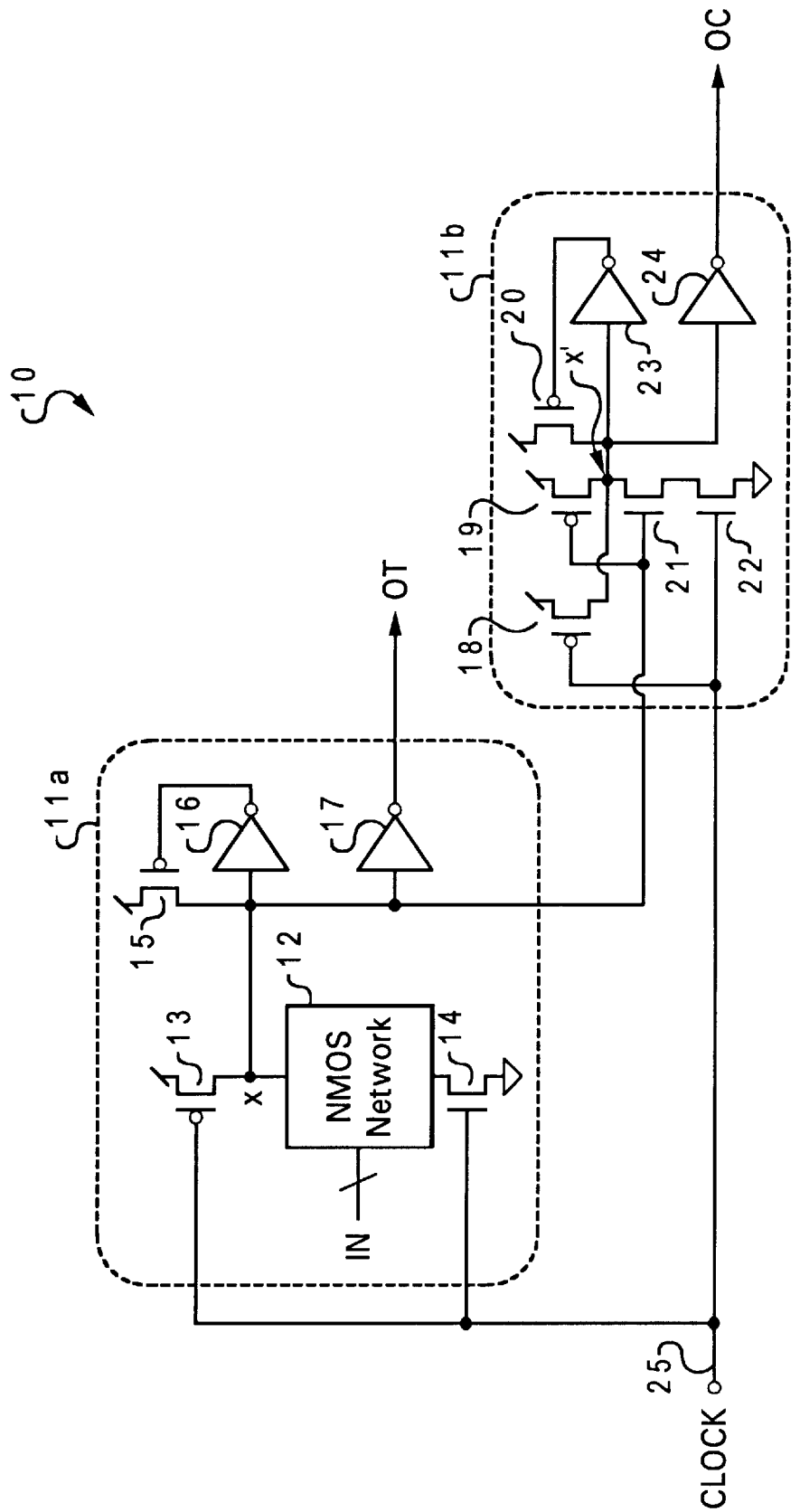
FIG. 1 is a circuit diagram of a true/complement signal generator according to the prior art.

Referring now to the drawings and in particular to FIG. 1, there is depicted a circuit diagram of a true/complement signal generator according to the prior art. As shown, a true/complement signal generator 10 includes a domino circuit 11a and a complement signal generator 11b. Domino circuit 11a includes an NMOS transistor network 12, transistors 13–15, and inverters 16–17. Transistor 15 and inverter 16 together form a half-latch circuit, and inverter 17 yields an output OT. Complement signal generator 11b includes transistors 18–22 and inverters 23–24. Transistor 20 and inverter 23 together form a half-latch circuit, and inverter 24 yields an output OC. Output OC is a complement of output OT.

As shown, output OT of true/complement signal generator 10 is connected to dynamic node x of domino circuit 11a via inverter 17. Therefore, the performance of output OT is directly affected by the pull down speed of dynamic node x. The pull down speed dynamic node x is determined by NMOS transistor network 12. In other words, the performance of output OT is basically determined by the complexity of NMOS transistor network 12. NMOS transistor network 12 is capacitive in nature, and the capacitance varies with the scale of NMOS transistor network 12. Thus, the more complicated NMOS transistor network 12 is, the more skewed output OT will be.

On the other hand, output OC of true/complement signal generator 10 is connected to node x' of complement signal generator 11b via inverter 24. Therefore, the performance of output OC is basically determined by transistors 19 and 21, especially the timing of clock 25. This is because complement generator 11b is usually much simpler than domino circuit 11a (attributed to the fact that NMOS transistor network 12 in domino circuit usually has more than one transistor). Because of the simplicity of signal generator 11b, output OC is more defined than output OT in terms of timing. By optimizing NMOS transistor network 12 and complement signal generator 11b, the output skew could be reduced to a certain degree. But there is a limitation to this methodology because of the fact that NMOS transistor network 12 is typically much more complicated than complement signal generator 11b. As such, it is very difficult to provide a balanced output between outputs OT and OC.

Figure 2:
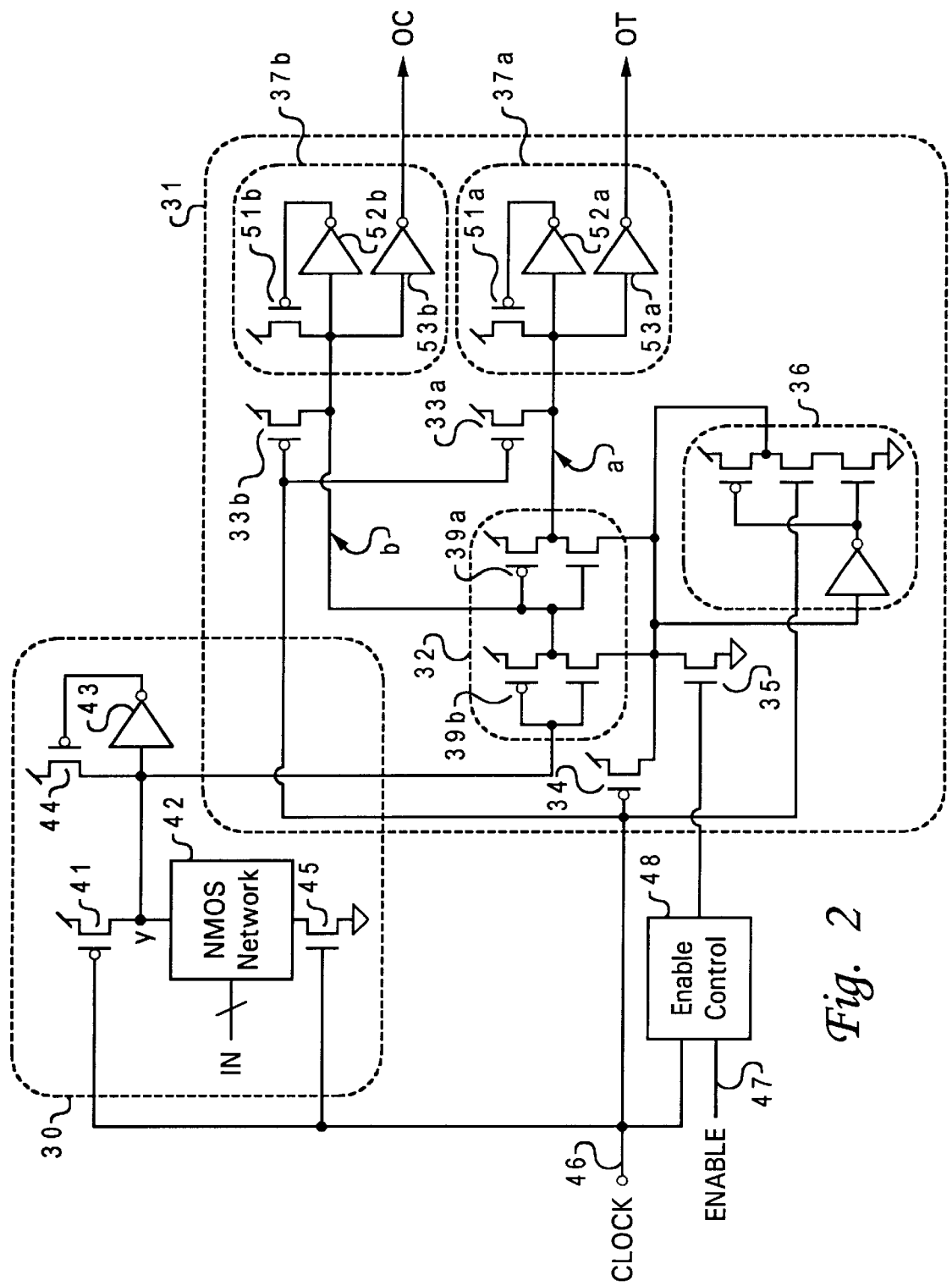
FIG. 2 is a circuit diagram of a true/complement signal generator in accordance with a preferred embodiment of the present invention.

With reference now to FIG. 2, there is depicted a circuit diagram of a true/complement signal generator in accordance with a preferred embodiment of the present invention. As shown, a true/complement signal generator 31 includes a cascaded inverter circuit 32, two precharge transistors 33a, 33b, a supplemental precharge transistor 34, an evaluate transistor 35, a full-latch circuit 36, and two half-latch with driving inverter circuits 37a, 37b.

Specifically, cascaded inverter circuit 32 includes an inverter 39b connected in series with an inverter 39a. In FIG. 2, the output of inverter 39b is shown to connect to the input of inverter 39a. The sources of the n-channel transistors within cascaded inverter circuit 32 are connected to the drain of evaluate transistor 35. The output of inverter 39b is further connected to half-latch with driving inverter circuit 37b; and the output of inverter 39a is connected to half-latch with driving inverter circuit 37a. Half-latch with driving inverter circuit 37a includes a half-latch circuit formed by a p-channel transistor 51a together with an invertor 52a, and a driving inverter 53a. Similarly, half-latch with driving inverter circuit 37b includes a half-latch circuit formed by a p-channel transistor 51b together with an invertor 52b, and a driving inverter 53b. The function of driving inverters 53a, 53b within half-latch with driving inverter circuits 37a, 37b are mainly for noise reduction; thus, it is possible to eliminate driving inverters 53a, 53b from half-latch with driving inverter circuits 37a, 37b, respectively, without affecting the functionality of half-latch with driving inverter circuits 37a, 37b. Precharge transistors 33a, 33b, which are p-channel transistors, precharge dynamic nodes a and b, respectively. The precharage operation is also supplemented by supplemental precharge transistor 34, also a p-channel transistor.

True/complement signal generator 31 is coupled to a domino circuit 30. Specifically, cascaded inverter circuit 32 of true/complement signal generator 31 is connected to domino circuit 30 at dynamic node y. Domino circuit 30 includes a precharge transistor 41, an NMOS transistor network 42, a half-latch circuit having an inverter 43 connected to a p-channel transistor 44, and a discharge transistor 45. The gates of precharge transistor 41 and discharge transistor 45 are connected to a clock 46. NMOS transistor network 42 contains multiple input transistors. These input transistors are generally n-channel enhancement mode devices, each having an input. Thus, when a logic high signal is applied to an input, the corresponding input transistor will be turned on. Precharge transistor 41, NMOS transistor network 42, and the half-latch circuit are all connected to a dynamic node y. The normal operation of dynamic logic circuit 30 is well-known to those who are skilled in the relevant art.

During the precharge phase, dynamic nodes a and b are initially precharged by precharged transistors 33a and 33b, respectively; and the precharage operation is supplemented by supplemental precharge transistor 34. During the evaluation phase, cascaded inverter circuit 32 detects the valid signal at dynamic node y in domino circuit 30 and converts the valid signal into two separate signals, one at dynamic node a and the other at dynamic node b. Dynamic node a yields an output OT via driving inverter 53a of half-latch with driving inverter circuits 37a, and dynamic node b yields an output OC via driving inverter 53b of half-latch with driving inverter circuits 37b. Output OC is a complement of output OT. Because half-latch with driving inverter circuits 37a and 37b are identical, the performances of output OT and output OC are determined by exactly the same circuit topology. As a result, output OT and output OC, which are provided by identical half-latch with driving inverter circuits 37a and 37b, should have identical timing.

Furthermore, node a or node b is pulled down through the respective n-channel transistor within cascaded inverter circuit 32 and evaluate transistor 35. Both pulldown paths are basically independent of the complexity of NMOS transistor network 42 within domino logic circuit 30.

True/complement signal generator 31 can be locally controlled by having an enable control block 48 connected to evaluate transistor 35. Enable control block 48 is preferably a two-input AND gate. With the configuration shown in FIG. 2, each of the pull-down paths of true/complement signal generator 31 is established only when an ENABLE signal 47 turns on the gate of evaluate transistor 35 via enable control block 48. Thus, true/complement signal generator 31 can be shut down by utilizing ENABLE signal 47 to turn off evaluate transistor 35 via enable control block 48. Furthermore, if clock 46 is controlled globally, enable control block 48 can be removed; though, in general, it is very difficult to manage a global clock in a synchronous design such as true/complement signal generator 31.

As has been described, the present invention provides an improved circuit for generating low skew true/complement signals. With true/complement signal generator 31 of the present invention, both nodes a, b are normally in a logical high state, because they are precharged. Therefore, output OT and output OC have pulse outputs potentially at the early stage of the evaluation phase. Also, when one of nodes a, b proceeds to a low state, either output OT or output OC will be turned off. In other words, the performance of true/complement signal generator 31 is determined by the pull-down speed of dynamic node y. This is the reason why true/complement signal generator 31 is faster than other prior art true/complement signal generators. Furthermore, because true/complement signal generator 31 is also a dynamic logic circuit, thus, a dual dynamic logic circuit configuration is provided when true/complement signal generator 31 is operated in conjunction with domino logic circuit 30.

In addition, output OT and output OC of true/complement signal generator 31 are well-balanced, and the timing difference between output OT and output OC is much less than that in the prior art circuit shown in FIG. 1. The skew of output OT and output OC of true/complement signal generator 31 can be optimized to nearly zero.

While the invention has been particularly shown and described with reference to a preferred embodiment, it will be understood by those skilled in the art that various changes in form and detail may be made therein without departing from the spirit and scope of the invention.

What is claimed is:

1. A true/complement signal generator for a dynamic logic circuit having a dynamic node, comprising:
    a cascaded inverter circuit connected to said dynamic node, wherein said cascaded inverter circuit includes a first inverter connected in series with a second inverter;
    a first half-latch circuit connected to an output of said second inverter to generate an output signal; and
    a second half-latch circuit connected to an output of said first inverter to generate a complement of said output signal.

2. The true/complement signal generator according to claim 1, wherein said first half-latch circuit and said second half-latch circuit are substantially identical.

3. The true/complement signal generator according to claim 1, wherein said first half-latch circuit includes a transistor coupled to an inverter.

4. The true/complement signal generator according to claim 3, wherein said first half-latch circuit further includes a driving inverter coupled to said inverter.

5. The true/complement signal generator according to claim 1, wherein said second half-latch circuit includes a transistor coupled to an inverter.

6. The true/complement signal generator according to claim 5, wherein said second half-latch circuit further includes a driving inverter coupled to said inverter.

7. The true/complement signal generator according to claim 1, wherein said cascaded inverter circuit is also connected to an evaluate transistor.

8. The true/complement signal generator according to claim 7, wherein said true/complement signal generator is turned off by an enable control connected to a gate of said evaluate transistor.

9. A method for generating true and complement signals for a dynamic logic circuit having a dynamic node, said method comprising:

connecting a cascaded inverter circuit to said dynamic node, wherein said cascaded inverter circuit includes a first inverter connected in series with a second inverter;

generate an output signal via a first half-latch circuit connected to an output of said second inverter; and generating a complement of said output signal via a second half-latch circuit connected to an output of said first inverter.

10. The method according to claim 9, wherein said first half-latch circuit and said second half-latch circuit are substantially identical.

11. The method according to claim 9, wherein said method further includes coupling a transistor to an inverter to form said first half-latch circuit.

12. The method according to claim 11, wherein said method further includes coupling a driving inverter to said transistor and said inverter to form said first half-latch circuit.

13. The method according to claim 9, wherein said method further includes coupling a transistor to an inverter to form said second half-latch circuit.

14. The method according to claim 13, wherein said method further includes coupling a driving inverter to said transistor and said inverter to form said second half-latch circuit.

* * * * *